US011513154B2

(12) United States Patent
Pasquino et al.

(10) Patent No.: US 11,513,154 B2
(45) Date of Patent: Nov. 29, 2022

(54) SYSTEM AND APPARATUS FOR MONITORING THE PERFORMANCE OF AN ELECTRICALLY POWERED DEVICE

(71) Applicant: Black & Decker Inc., New Britain, CT (US)

(72) Inventors: Jeffrey B. Pasquino, Elkridge, MD (US); Lara Kudryk-Traska, Monkton, MD (US); Dalton S. Dawkins, Portland, OR (US); Raymond D. Brubaker, Ellicott City, MD (US); Grzegorz J. Kwiatkowski, Cumming, GA (US); Joshua M. Hooks, Atlanta, GA (US); Stephen Skeels, Forest Hill, MD (US); Richard B. Lewis, Round Rock, TX (US)

(73) Assignee: Black & Decker Inc., New Britain, CT (US)

( * ) Notice: Subject to any disclaimer, the term of this patent is extended or adjusted under 35 U.S.C. 154(b) by 180 days.

(21) Appl. No.: 16/550,481

(22) Filed: Aug. 26, 2019

(65) Prior Publication Data

US 2020/0072905 A1 Mar. 5, 2020

Related U.S. Application Data

(60) Provisional application No. 62/727,927, filed on Sep. 6, 2018, provisional application No. 62/725,539, filed on Aug. 31, 2018.

(51) Int. Cl.
*G06F 3/0482* (2013.01)
*B25F 5/00* (2006.01)
(Continued)

(52) U.S. Cl.
CPC ............ *G01R 31/343* (2013.01); *H04L 67/12* (2013.01); *G06F 3/0482* (2013.01)

(58) Field of Classification Search
CPC .... G01R 31/343; G06F 3/0482; G06Q 10/06; H04L 67/12; B25F 5/00
See application file for complete search history.

(56) References Cited

U.S. PATENT DOCUMENTS

| 5,710,723 A | 1/1998 | Hoth et al. |
| 7,333,922 B2 | 2/2008 | Cannon |
(Continued)

FOREIGN PATENT DOCUMENTS

| CN | 106161489 A | 11/2016 |
| EP | 2504847 A | 10/2012 |
(Continued)

OTHER PUBLICATIONS

Asilturk et al., Intelligent Adaptive Control and Monitoring of Band Sawing, 2008 IEEE, pp. 967-973 (Year: 2008).*
(Continued)

*Primary Examiner* — Toan M Le
(74) *Attorney, Agent, or Firm* — Amir R. Rohani

(57) ABSTRACT

A system is provided including a current sensor arranged to sense current drawn by an electric motor of a powered device through an AC power line from a power supply and provide current data related to the powered device; a monitoring device arranged to receive the current data from the electrical sensor, the monitoring device including a controller processing the current data to obtain performance data associated with the powered device, the performance data relating to load applied to the electric motor; a data communication device communicating with the monitoring device and arranged to receive the performance data associated with the powered device; and a computing device including a graphical user interface, the computer device receiving a user's selection of the powered device from a list of powered devices and presenting the performance data to
(Continued)

the user via the graphical user interface in response to the user's selection.

14 Claims, 12 Drawing Sheets

(51) Int. Cl.
*G01R 31/34* (2020.01)
*H04L 67/12* (2022.01)

(56) References Cited

U.S. PATENT DOCUMENTS

| | | |
|---|---|---|
| 8,270,130 B1 | 9/2012 | McMullen |
| 9,108,285 B2 | 8/2015 | Usselman |
| 9,575,091 B2 | 2/2017 | Reeder, III |
| 9,615,147 B2 | 4/2017 | Radosavljevic et al. |
| 9,901,998 B2 | 2/2018 | Huang et al. |
| 2007/0252578 A1 | 11/2007 | Luo |
| 2010/0328849 A1 | 12/2010 | Ewing |
| 2015/0185751 A1 | 7/2015 | Karc et al. |
| 2015/0277431 A1 | 10/2015 | Taylor |
| 2015/0377947 A1 | 12/2015 | Hai |
| 2017/0216986 A1 | 8/2017 | Dey, IV |
| 2017/0359634 A1 | 12/2017 | Stampfl et al. |
| 2018/0024540 A1 | 1/2018 | Livesay et al. |
| 2018/0085837 A1 | 3/2018 | Koegel et al. |
| 2019/0072461 A1 | 3/2019 | Thirani et al. |

FOREIGN PATENT DOCUMENTS

| | | |
|---|---|---|
| EP | 2695691 A | 2/2014 |
| EP | 3064323 A1 | 9/2016 |
| EP | 3086295 A | 12/2016 |
| EP | 2938466 B | 2/2017 |
| WO | 15100083 A | 7/2015 |
| WO | 16025963 A | 2/2016 |
| WO | 16195899 A | 12/2016 |
| WO | 2017194617 A1 | 11/2017 |

OTHER PUBLICATIONS

IEEE Xplore Search results, May 16, 2021, 1 pp. (Year: 2021).*
Yang et al., A Unified Framework and Platform for Designing of Cloud-Based Machine Health Monitoring and Manufacturing Systems, Aug. 2015, Journal of Manufacturing Science and Engineering, vol. 137, 6 pp. (Year: 2015).*
EP EESR dated, Dec. 10, 2019 in corresponding EP application 19193989.1.

* cited by examiner

SYSTEM AND APPARATUS FOR MONITORING THE PERFORMANCE OF AN ELECTRICALLY POWERED DEVICE

RELATED APPLICATION

This application claims the benefit of U.S. Provisional Patent Application No. 62/725,539 filed Aug. 31, 2018, and U.S. Provisional Patent Application No. 62/727,927 filed Sep. 6, 2018, both of which are incorporated herein by reference in their entireties.

FIELD OF THE DISCLOSURE

This disclosure relates to a system and device for monitoring the performance of an electrically powered device, and in particular to a system for sensing and monitoring an electrical parameter of the device and reporting on the performance of the device using on the sensed parameter.

BACKGROUND

Electric motors are used in a vast variety of machines and equipment such as power tools, industrial machines, outdoor products, etc. With the growth of Internet of Things technology, there have been developments in recent years in providing internet connectivity and wireless control for motorized machines and equipment. However, no comprehensive system is currently available capable of collection and reporting performance information related to motorized machines and equipment, particularly for conventional machines and equipment that are not manufactured with wireless connectivity. What is needed is a system that is easy to use with a wide range of motorized machines and equipment capable of collecting and reporting data related to the performance, usage, and efficiency of the machines and equipment and their components.

SUMMARY

According to an embodiment of the invention, a system is provided including a current sensor arranged to sense current drawn by an electric motor of a powered device through an alternating-current (AC) power line from a power supply and provide current data related to the powered device; a monitoring device arranged to receive the current data from the electrical sensor, the monitoring device including a controller configured to process the current data to obtain performance data associated with the powered device, the performance data being related to load applied to the electric motor of the powered device; a data communication device communicating with the monitoring device and arranged to receive the performance data associated with the powered device; and a computing device including a graphical user interface, the computer device receiving a user's selection of the powered device from a list of powered devices and presenting the performance data to the user via the graphical user interface in response to the user's selection.

In an embodiment, the current sensor is provided as a clamping device on a power line from the power source to the powered device.

In an embodiment, the electric motor is configured to drive an operating member to perform an operation, and the monitoring device is configured to determine at least one of a number of operations, operation time, average operation time, and efficiency of the powered device based on the current data.

In an embodiment, the powered device is an industrial band saw.

In an embodiment, the monitoring device is configured to determine at least one of a number of cuts and an average time per cut for the industrial band saw based on the current data.

In an embodiment, the computer device receives the user's selection of a period of time and presents at least one of the number of operations, operation time, average operation time, and efficiency of the powered device to the user within the period of time via the graphical user interface.

In an embodiment, the monitoring device is configured to detect when the motor is turned ON when current draw increases from zero to a baseline value, and detect an operation cycle by the electric motor when the current draw cycles from the baseline value to an upper value and back to the baseline value.

In an embodiment, the monitoring device is configured to calculate at least one of the number of operations, total operation time, average operation time, and efficiency of the powered device based on the number of operation cycles within a given time period.

In an embodiment, the monitoring device is configured to compare a current waveform associated with the operation cycle to a plurality of predetermined operation cycle current waveforms to determine a type of workpiece being operated on by the powered device.

In an embodiment, the monitoring device is configured to compare a current waveform associated with the operation cycle to a predetermined operation cycle current waveform to determine abnormalities associated with the operation cycle.

In an embodiment, the powered device is an industrial band saw having a cutting blade and the monitoring device is configured to determine that the cutting blade does not operate at a normal cutting speed based on variations between at least one of duration, magnitude, the rate of rise time, and the rate of fall time of the current waveform associated with the operation cycle in comparison to the predetermined operation cycle current waveform.

According to an embodiment of the invention, a system is provided including: a plurality of current sensors associated with a plurality of powered devices, each current sensor being arranged to sense current drawn by an electric motor of an associated powered device through an alternating-current (AC) power line from a power supply and provide current data related to the powered device; a plurality of monitoring devices each arranged to receive the current data from the electrical sensor, each monitoring device including a controller configured to process the current data to obtain performance data associated with the powered device, the performance data being related to load applied to the electric motor of the powered device; a device management unit configured to manage the plurality of monitoring devices to transmit performance data associated with the plurality of powered devices to a remote server; and a computing device including a graphical user interface, the computer device receiving a user's selection associated with one of the plurality of powered devices from a list and presenting the performance data associated with the selection to the user in response via the graphical user interface.

According to an embodiment, a monitoring device is provided including: a housing; a current input interface supported by the housing and arranged to be electrically coupled to a current sensor, the current sensor being provided to sense current drawn by an electric motor of a powered device through an alternating-current (AC) power line from a power supply and provide current data related to the powered device; and a controller configured to process the current data to obtain performance data associated with the powered device, the performance data being related to load applied to the electric motor of the powered device.

In an embodiment, the housing of the monitoring device is mountable on the industrial machine and the current sensor comprises a clamp mounted outside an insulation sleeve of the power line.

In an embodiment, the monitoring device is configured to detect when the motor is turned ON when current draw increases from zero to a baseline value, and detect an operation cycle by the electric motor when the current draw cycles from the baseline value to an upper value and back to the baseline value.

BRIEF DESCRIPTION OF THE DRAWINGS

The drawings described herein are for illustration purposes only and are not intended to limit the scope of this disclosure in any way.

Corresponding reference numerals indicate corresponding parts throughout the several views of the drawings.

DETAILED DESCRIPTION

Figure 1:
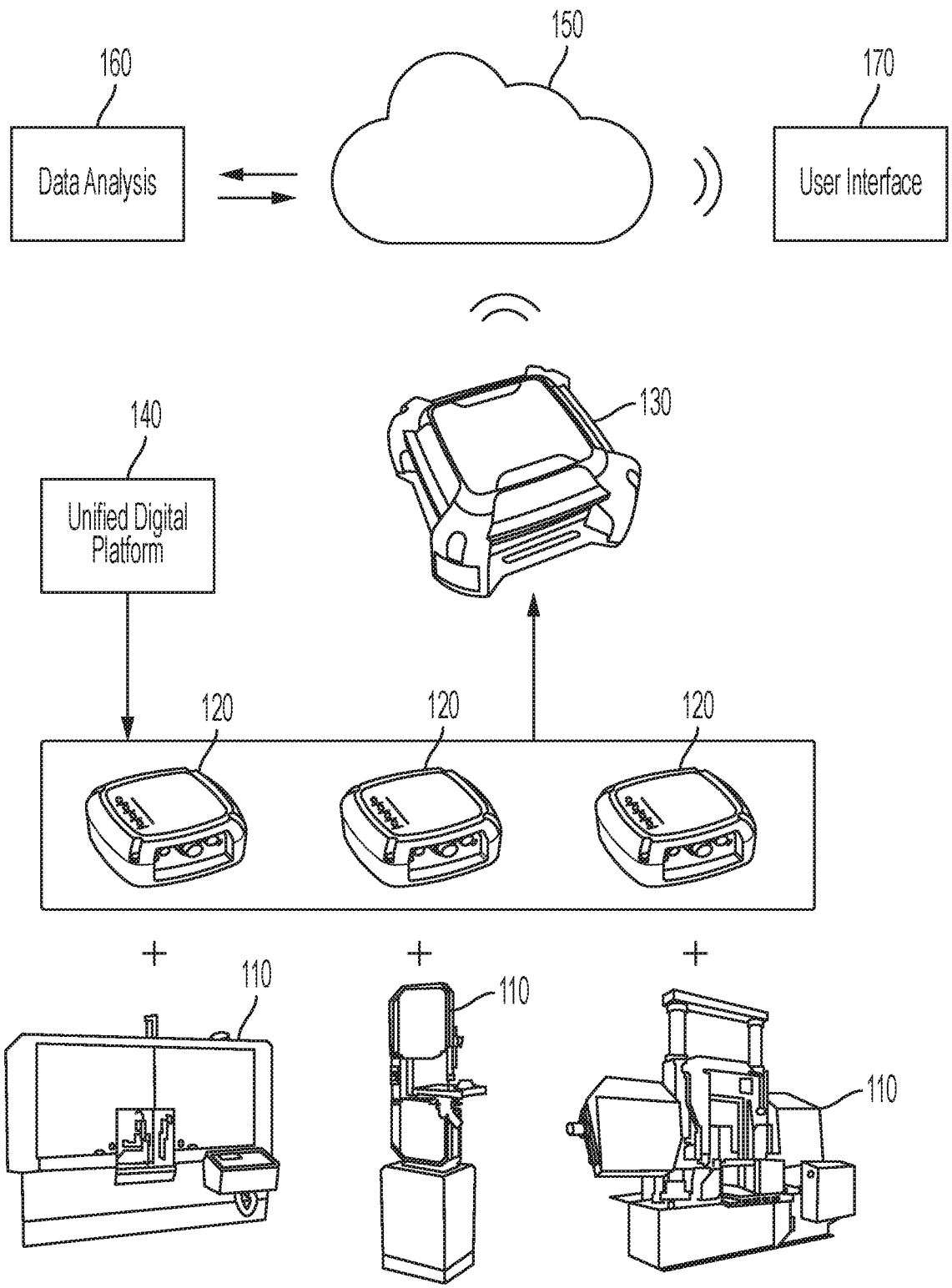
FIG. 1 depicts a block diagram of an exemplary system for monitoring and reporting the performance of a series of electrically-powered devices, in this case industrial machines, within a facility, according to an embodiment.

The following description illustrates the claimed invention by way of example and not by way of limitation. The description clearly enables one skilled in the art to make and use the disclosure, describes several embodiments, adaptations, variations, alternatives, and uses of the disclosure, including what is presently believed to be the best mode of carrying out the claimed invention. Additionally, it is to be understood that the disclosure is not limited in its application to the details of construction and the arrangements of components set forth in the following description or illustrated in the drawings. The disclosure is capable of other embodiments and of being practiced or being carried out in various ways. Also, it is to be understood that the phraseology and terminology used herein is for the purpose of description and should not be regarded as limiting.

FIG. 1 depicts a block diagram of an exemplary system 100 for monitoring and reporting the performance of a series of electrically-powered devices 110 within a facility, according to an embodiment. In an embodiment, powered devices 110 may be any type of electrical machine, in particular industrial devices and equipment such as, but not limited to, industrial band saws, welding machines, fastening machines, etc., provided within a facility. By way of example, embodiments of this disclosure are depicted and described with reference to a band saw for cutting large metal workpieces, though it should be understood that the teachings of this disclosure in principal apply to monitoring performance of any other type of electrically-powered device.

In an embodiment, system 100 includes one or more sensor monitors 120 associated with powered devices 110 provided within a work facility. In an embodiment, each sensor monitor 120 is coupled to an electrical sensor (not shown) that is arranged to sense an electrical parameter of the corresponding powered device 110. In an embodiment, the electrical sensor is a current sensor that senses an input current through a power cord providing AC power to the powered device 110. The sensor monitors 120 receive electrical signals from the current sensors and provide data relating to the performance of the powered devices 110, as discussed below in detail.

In an embodiment, the sensor monitors 120 are wirelessly coupled via a known wireless protocol, for example, Wi-Fi, to a wireless access point 130. Wireless access point 130 may be constructed according to any known method and configured to provide secure and reliable wireless connectivity to the sensor monitors 120 within a facility.

In an embodiment, a Device Management Unit (DMU) 140 provides a platform for managing the sensor monitors 120 provided within the facility. The DMU 140 executes software for managing the connectivity, data transfer, data storage, network security, and/or application enablement of the sensor monitors 120. Using the wireless access point 130 and managed by DMU 140, the sensor monitors 120 provide data pertaining to the performance of the powered devices 110 to a cloud 150.

In an embodiment, a data analysis unit 160 is provided in network communication with the cloud to perform data analysis on the data relating to the powered devices 110 provided by the sensor monitors 120. In an embodiment, data analysis unit 160 receives raw data, for example, raw current data including large number of data points, for each of the powered devices 110 from the cloud 150, and conducts data analysis on the raw data to compile performance information related to the powered devices 110. In an embodiment, the sensor monitor 120 performs some preliminary data analysis on the raw data, for example, to detect major changes in current, in order to reduce the total amount of data transferred to the cloud 150. The data analysis unit 160 then uses the data in the cloud to perform the needed statistical analysis discussed later in this disclosure.

In an embodiment, one or more user interfaces 170 are provided on computing devices in network communication with the cloud 150 to display the complied performance information related to the powered devices 110 on a display to a user in an interactive manner, as discussed below in detail.

It should accordingly be understood that data analysis as described in this disclosure may be performed at any stage within the system 100, including the sensor monitor 120, the wireless access point 130, the data analysis unit 160, or the user interface 170 computing device, alone or in combination.

Figure 2:
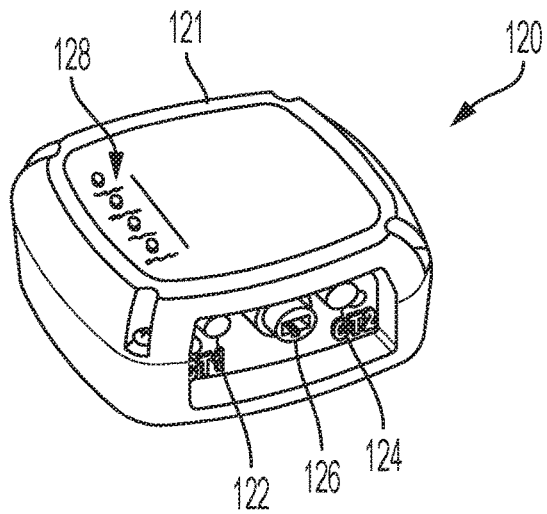
FIG. 2 depicts a perspective view of an exemplary sensor monitor, according to an embodiment.

FIG. 2 depicts a perspective view of an exemplary sensor monitor 120, according to an embodiment. As shown in this figure, each sensor monitor 120 includes a main housing 121 that can be securely mounted in relation to a powered device 110, e.g., on the outside body of the powered device 110 or on a wall adjacent the powered device 110 power supply. In an embodiment, sensor monitor 120 includes two input ports 122 and 124 that can be coupled to two individual electrical sensors (not shown). Each electrical sensor, which may be for example a current sensor, may be provided to sense the input current supplied to powered device 110. Thus, in an embodiment, each sensor monitor 120 may be provided in relation to two powered devices 110. The sensor monitor 120 further includes a power supply port 126 provided to power the sensor monitor 120, as well as a series of light-emitting diodes (LEDs) 128. In an embodiment, four LEDs 128 indicate the status of power supply, sensor connectivity, and WiFi connectivity.

In an embodiment, each sensor monitor 120 is additionally coupled to additional sensors disposed within in the proximity of the powered devices 110 to measure other electrical and/or mechanical characteristics of the respective powered devices 110. Examples of such additional sensors include, but are not limited to, voltage sensors, temperature sensors, proximity sensors, etc.

In an embodiment, a voltage sensor may be coupled to a relay or other switches on the power supply line from the power source to the power device 110. Voltage sensor provides the sensor monitor 120 with a digital or an analog signal indicative of existence or amount of voltage on the power supply line. The voltage parameter can be used to identify various machine operations such as its ON/OFF status. In an embodiment, sensor monitor 120 may include a counter that keeps track of the number of times the respective powered device 110 has been turned ON or OFF.

In an embodiment, powered devices 110 may be provided with one or more thermistors. The thermistor may be provided in close proximity to the motor, the blade, switching components, or other areas of powered devices that are prone to generating significant heat. In an embodiment, the thermistor is coupled to the sensor monitor 120 via a wired connection to provide a temperature signal to the sensor monitor 120.

In an embodiment, powered devices 110 may additionally provided with one or a proximity sensors. The proximity sensor may be a magnetic sensor, a motion sensor, etc. arranged to detect presence and/or position of a moving part. In an embodiment, the proximity sensor may be arranged to detect presence and/or position of a cutting workpiece (e.g., an I-beam) within the path of the cutting blade of the powered device. In an embodiment, the proximity sensor may be arranged to detect presence and/or position of the cutting blade itself, a flywheel mounted on the shaft of the motor, a safety handle, or any other moving or removable part. In an embodiment, the proximity sensor is coupled to the sensor monitor 120 via a wired connection to provide a digital signal to the sensor monitor 120.

Figure 3:
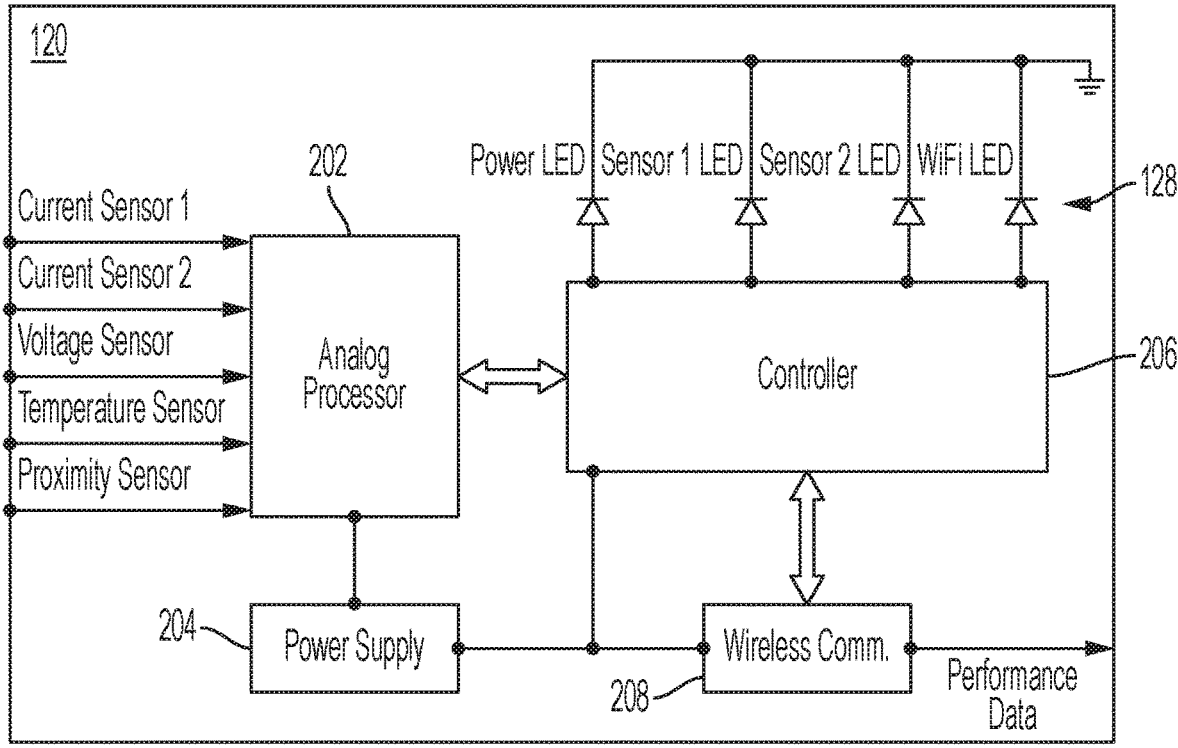
FIG. 3 depicts a block circuit diagram of the exemplary sensor monitor, according to an embodiment.

FIG. 3 depicts block circuit diagram of the exemplary sensor monitor 120, according to an embodiment. As shown in this figure, sensor monitor 120 includes an analog processor 202, a power supply 204, a controller 206, and a wireless communication unit 208.

In an embodiment, analog processor 202 receives sensed data from the electrical sensor and provides the controller 206 with data suitable for processing. In an embodiment, analog processor receives raw analog current data from electrical sensor and provides the same current data at a lower voltage level to the controller 206.

In an embodiment, the controller 206 analyzes the current data to detect operational data related to the performance of the powered devices 110. For example, controller 206 uses current waveforms from the current data to determine when the powered device 110 is ON v. OFF, when it is idle v. performing a cutting operation, how long it takes the powered device 110 to perform a cutting operation, the type of cutting operation performed, efficiency of use, etc. These will be described later in detail.

In an embodiment, wireless communication unit 208 receives processed data from the controller 206 and transmits it wirelessly via wireless access point 130 to the cloud 150.

Figure 4:
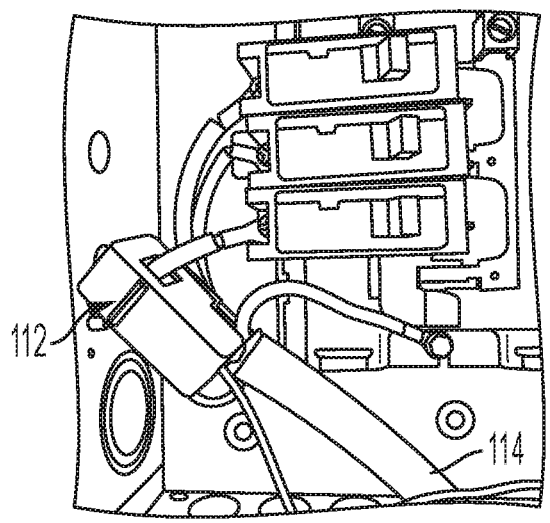
FIG. 4 depicts a perspective view of an electrical sensor mounted on a power cord of a powered device, according to an embodiment.

FIG. 4 depicts a perspective view of an electrical sensor 112 mounted on a power cord 114 of the powered device 110, according to an embodiment. In this embodiment, electrical sensor 112 is a current sensor includes a clamp that is mounted on the outside of the insulation sleeve of the power cord 114. The current sensor senses the current drawn by the powered device 110 through the power cord 114 and provides a signal to the sensor monitor 120 accordingly. In the depicted embodiment, electrical sensor 112 is positioned inside a circuit breaker box that supplies power to the powered device 110, though it should be understood that electrical sensor 112 may be positioned anywhere on the power card 114 as suitable.

Figure 5:
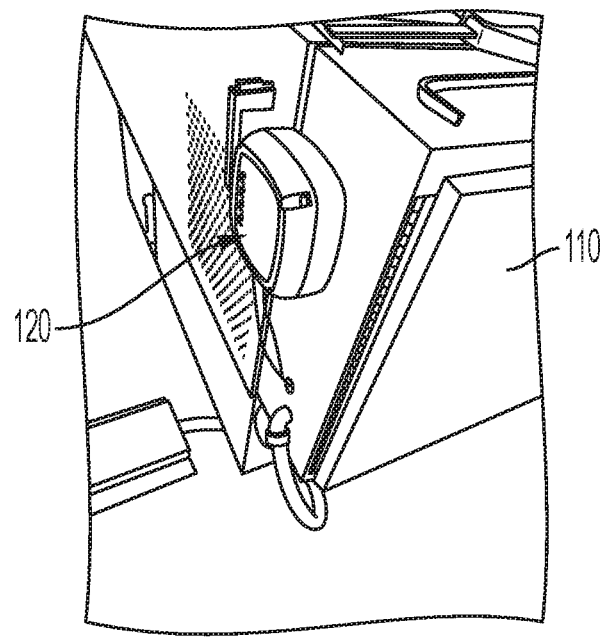
FIG. 5 depicts an exemplary view of a sensor monitor mounted on a powered device, according to an embodiment.

FIG. 5 depicts an exemplary view of a sensor monitor 120 mounted on a powered device 110, according to an embodiment. As shown herein, sensor monitor 120 may be fastened to an outside body of the powered device 110 via any known means such as screws or rivets. Sensor monitor 120 may alternatively be fastened to an outside housing of a circuit breaker box or mounted on a wall of the factory in close proximity to the circuit breaker box or the powered device 110.

Referring to FIGS. 6-12 and with continued reference to FIGS. 2 and 3, data analysis performed by sensor monitor 120 and/or data analysis unit 160 is described in detail herein.

In an embodiment, sensor monitor 120 (particularly the controller 206 of the sensor monitor 120) is configured to monitor data (e.g., current data) received from the electrical sensor 112 to determine the operating conditions of the powered device 110. In an embodiment, sensor monitor 120 receives large number of data points corresponding to every current reading through the power cord 114 from the electrical sensor 112 and detects changes in current data. In an embodiment, the sensor monitor 120 may detect such changes greater than a certain threshold and/or greater than a certain rate of change.

In an embodiment, sensor monitor 120 constructs a current-time waveform from either the raw data or the detected data. Sensor monitor 120 further detects operational conditions related to the powered device 110 based on current changes, for example, when the powered device 110 is turned ON and OFF, when it is idle, when it is performing a cutting operation, and the amount of time it takes to complete each cutting operation, etc.

Figure 6:
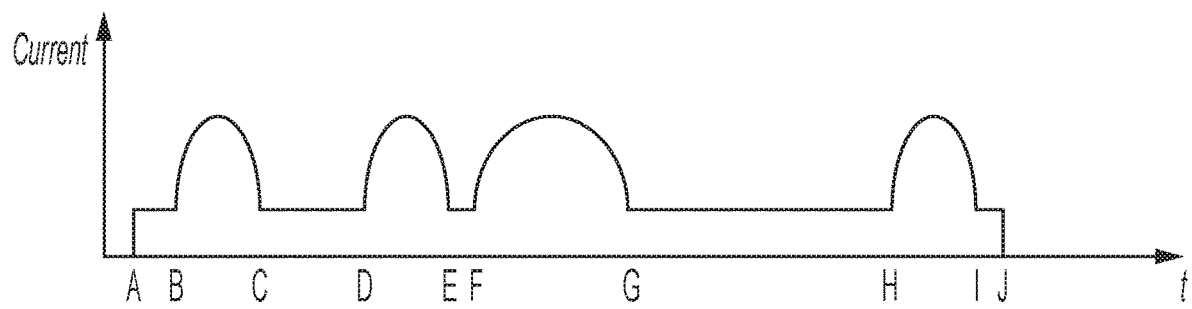
FIGS. 6 and 7 depict two exemplary current-time waveform diagrams representing the current data detected by the sensor monitor, according to an embodiment.
Figure 7:
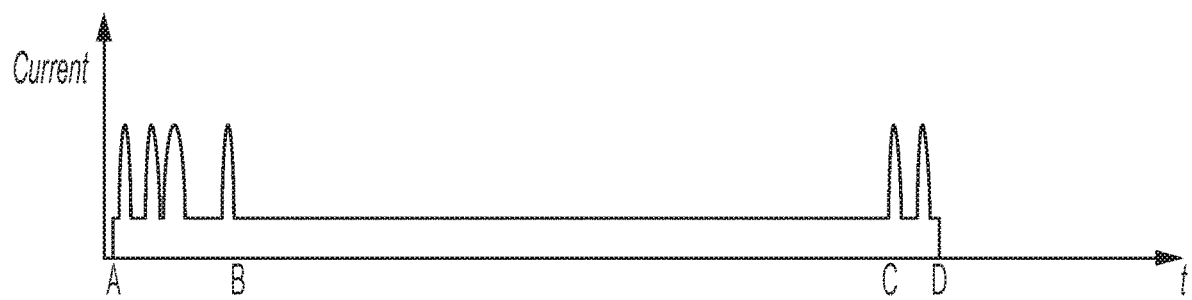
Figure 8A:
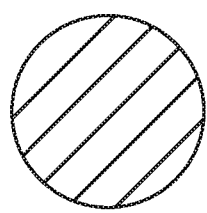
FIGS. 8A-8F depict exemplary side views of various workpieces to be cut by the powered device, specifically a solid round piece, a solid square piece, a hollow round piece, a hollow square piece, an I-beam, and a V-beam, respectively, according to an embodiment.
Figure 9A:
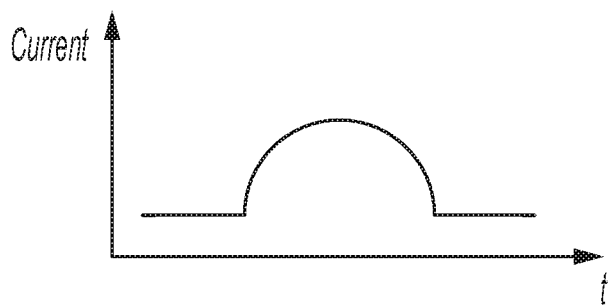
FIGS. 9A-9F depict exemplary current profiles respectively corresponding to workpieces of FIGS. 8A-8F, according to an embodiment.
Figure 8B:
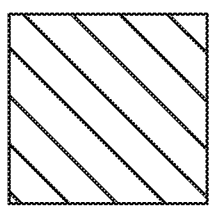
Figure 9B:
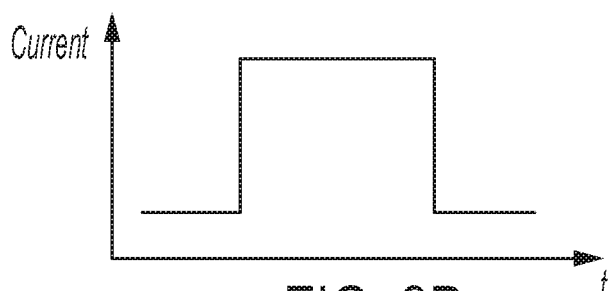
Figure 8C:
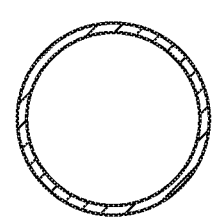
Figure 9C:
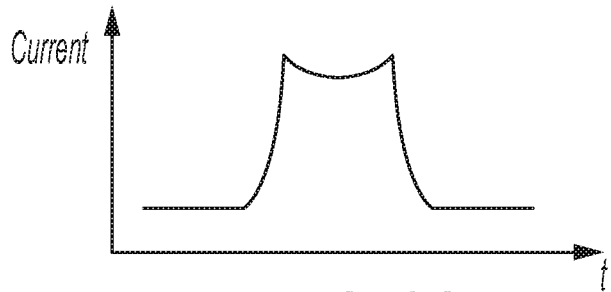
Figure 8D:
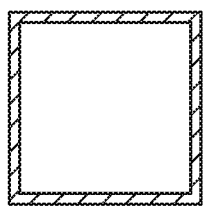
Figure 9D:
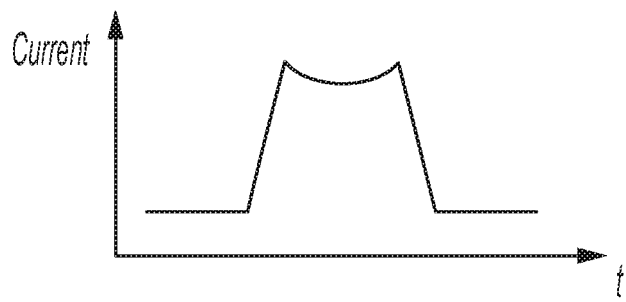
Figure 8E:
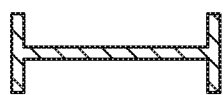
Figure 9E:
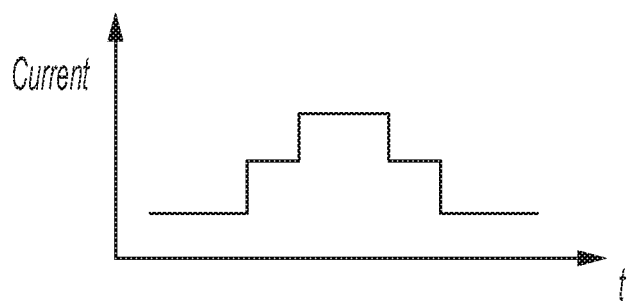
Figure 8F:
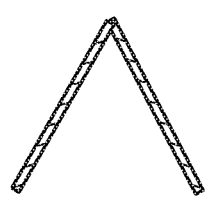
Figure 9F:
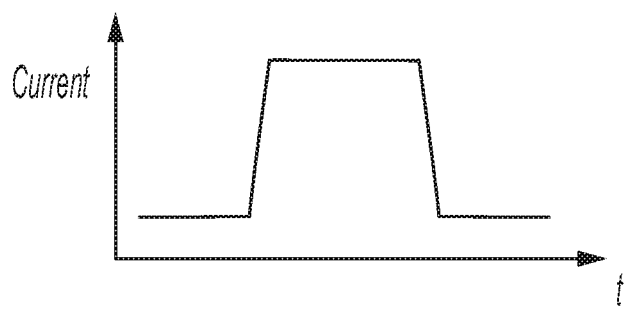

FIGS. 6 and 7 depict two exemplary current-time waveform diagrams representing the raw current data detected by the sensor monitor 120, according to an embodiment. The waveform of FIG. 7 covers a relatively larger time window than the waveform of FIG. 6. In the example of FIG. 6, sensor monitor 120 detects that the powered device 110 is turned ON at A when current draw is initiated, and turned OFF at J when current draw drops back to 0. Sensor monitor 120 also detects that a cutting operation is performed during the B-C, D-E, F-G and H-I time intervals, and that the powered device 110 is idle during the A-B, C-D, E-F, G-H and I-J time intervals. Using these metrics, sensor monitor 120 can calculate the total ON-time, idle-time, and cut-time for the powered device 110. Further, in an embodiment, sensor monitor 120 may be configured to detect that an unusually-long cutting operation during the F-G time interval. Also, in the example of FIG. 7, sensor monitor 120 may be configured to detect cutting operations during periods A-B and C-D, but an unusually-long idle-time during the B-D time interval. In an embodiment, the system 100 may use such data for efficiency calculations and/or to alert the user about cutting abnormalities.

In an embodiment, sensor monitor 120 may transfer the detected operational data to the cloud 150 for further statistical analysis and data management by data analysis unit 160 and/or the user interface 170 computing device. Alternatively, the sensor monitor 120 may conduct the additional statistical analysis and data management on the operational data. The operational data is provided to the user on user interface 170, along with statistical analysis relating to performance of power devices 110. In an embodiment, other metrics such as the type of cutting operation performed, efficiency of cut, blade wear, etc. may further be detected using the operational data.

According to an embodiment, sensor monitor 120 and/or data analysis unit 160 may detect the type of workpiece that is being operated on (e.g., being cut) by the powered device 110, using the operational data detected by the sensor monitor 120.

FIGS. 8A-8F depict exemplary side views of various workpieces to be cut by the powered device 110, specifically a solid round piece, a solid square piece, a hollow round piece, a hollow square piece, an I-beam, and a V-beam, respectively, according to an embodiment. FIGS. 9A-9F depict exemplary current-time profiles respectively corresponding to workpieces of FIGS. 8A-8F, according to an embodiment. In an embodiment, sensor monitor 120 and/or data analysis unit 160 compares a detected current-time waveform obtained from a cutting operation to these current-time profiles and determines what type of workpiece was cut accordingly. In an embodiment, this determination may be made by comparing, for example, the rate and shape of the rise time, the peak, and the fall time within each detected current-time waveform to predetermined current-time profiles and select the profile that is the most similar. In an embodiment, statistics relating to such data may be provided to the user on user interface 170.

According to an embodiment, sensor monitor 120 and/or data analysis unit 160 may further detect abnormalities in the operation of the powered device 110, for example in the length of time it takes the powered device 110 to perform a cutting operation, using the operational data detected by the sensor monitor 120.

Figure 10:
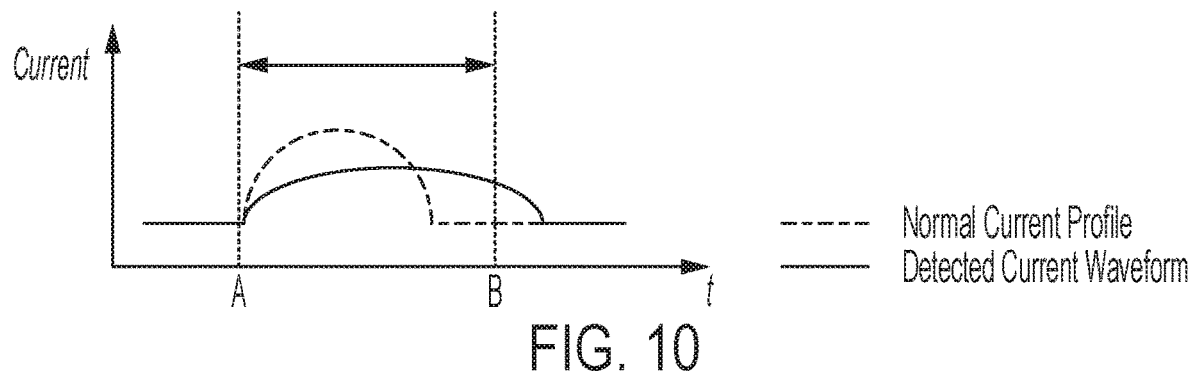
FIGS. 10-12 depict exemplary detected and expected current profiles used for determining an abnormal condition, according to an embodiment.
Figure 11:
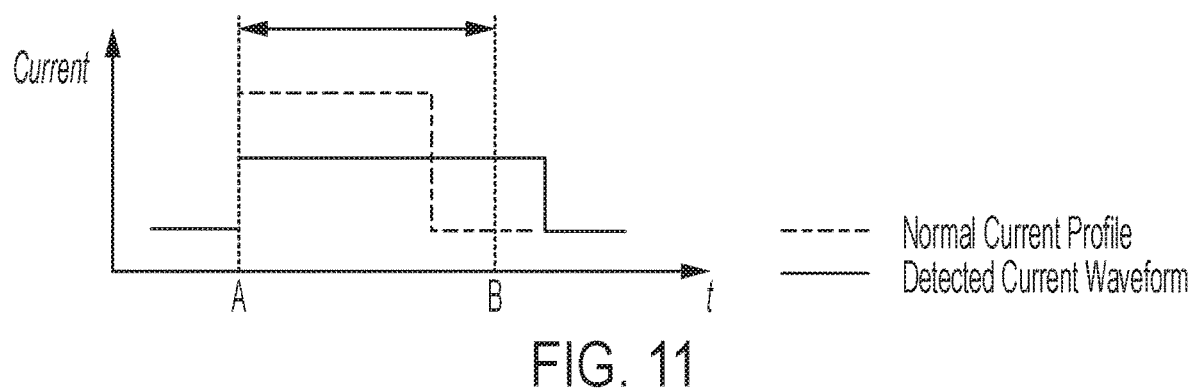
Figure 12:
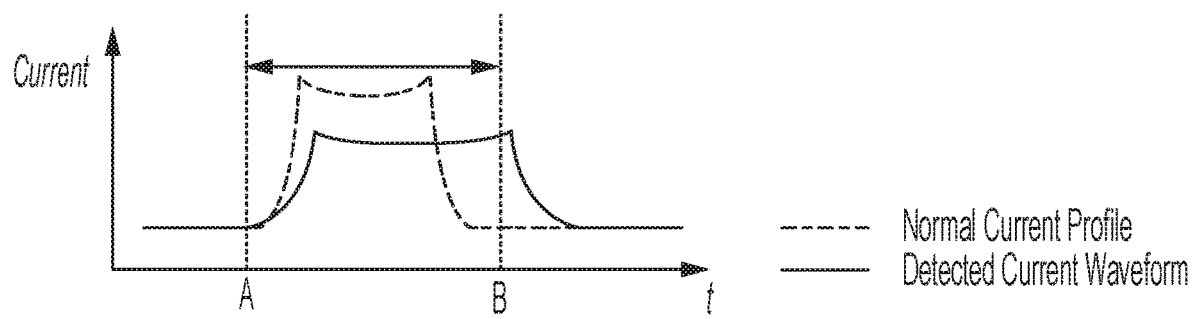

FIGS. 10-12 depict exemplary detected current waveform and normal current profiles used for determining an abnormal condition, according to an embodiment. In an embodiment, if the detected cut waveform takes significantly longer to complete than a normal cut, e.g., longer than threshold period A-B, the sensor monitor 120 and/or data analysis unit 160 may detect an abnormality in the cutting operation. Additionally and/or alternatively, the sensor monitor 120 may detect an abnormality using the magnitude of the current, the rate of the rise time and fall time of the current profile, etc. Repeated detection of an abnormal condition may be indicative that the powered device 110 requires repair or that the cutting blade needs to be changed, and the user may be accordingly alerted via user interface 170.

In an embodiment, operational data processed by sensor monitor 120 and/or data analysis unit 160 is presented to a user via user interface 170. Data analysis unit 160 may be provided as a part of, or separately from, a computing device associated with user interface 170. In an embodiment, the computing device associated with the user interface 170 may also be configured to process and customize the operational data in a format ready for display on the user interface 170.

Referring to FIGS. 13-18, the graphical user interface 170 presented to the user is described herein in detail.

Figure 13:
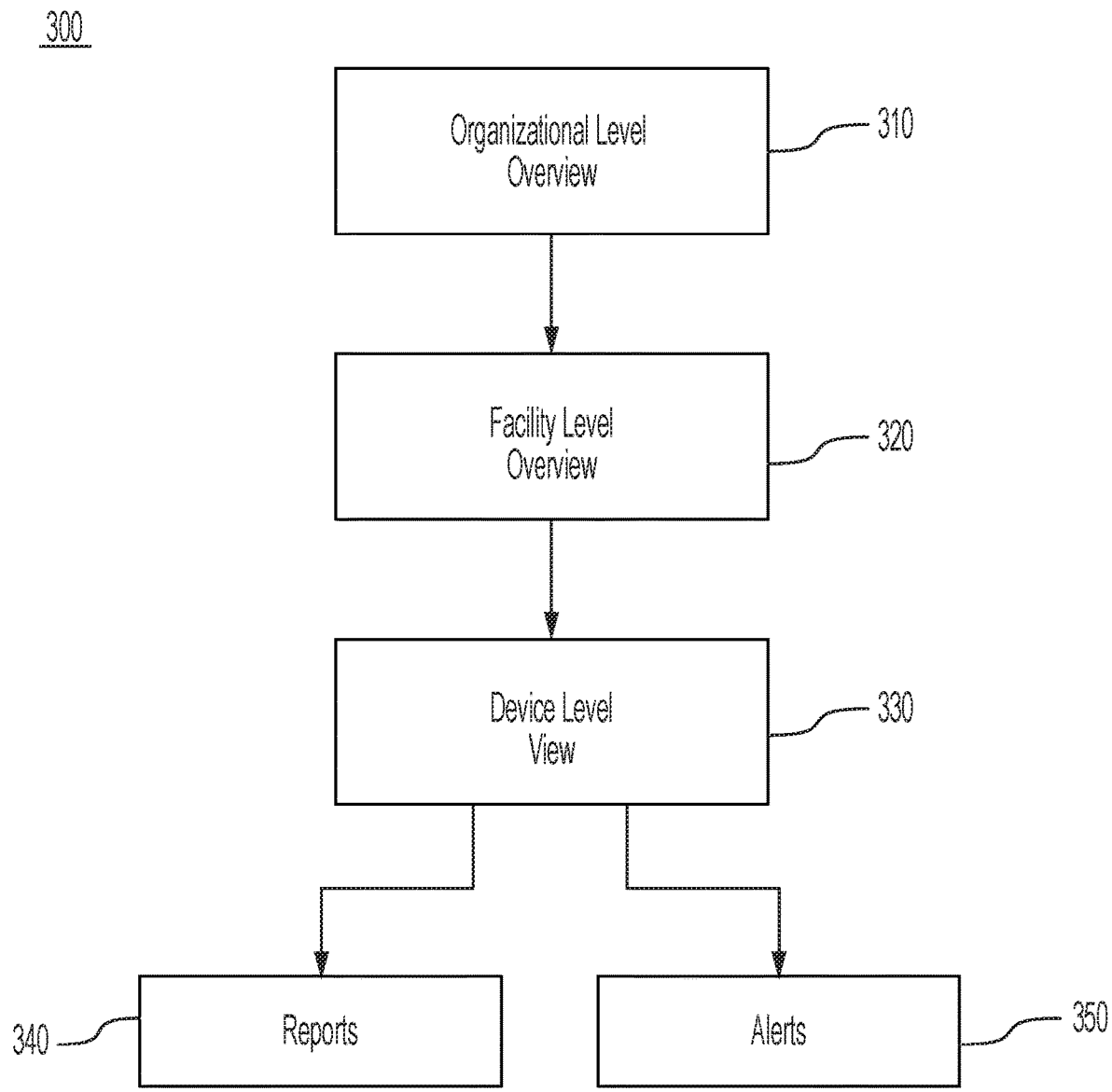
FIG. 13 depicts a hierarchical flow diagram relating to a graphical user interface (GUI) presented to a user on a computing device, according to an embodiment.

FIG. 13 depicts a hierarchical flow diagram relating to a graphical user interface (GUI) 170 presented to a user on a computing device, according to an embodiment. As shown herein, the user may be provided with graphical overviews at multiple levels of hierarchy, namely an organizational level overview 310, a facility level overview 320, and a device level view 330. User interface 170 is designed to interactively receive input from the user and provide statistical analysis, charts, graphs, etc. relating to operation of powered devices 110 at an organization level, facility level, and device level. The user may also request and be supplied with reports 340 relating to the organization, facility, or a device, customizable to include performance data required by the user. The user may also set up alerts 350 in the event of a condition indicative of device failure or underperformance.

Figure 14:
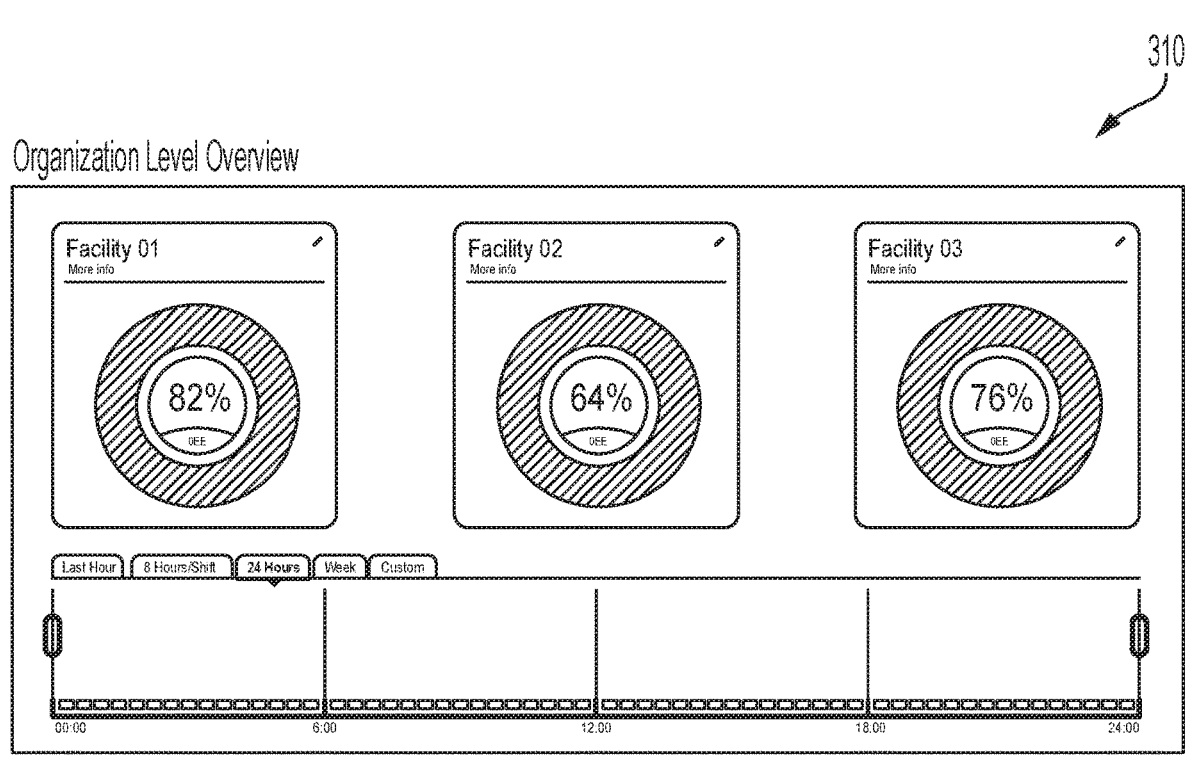
FIG. 14 depicts an exemplary organizational level overview graphical interface, according to an embodiment.

FIG. 14 depicts an exemplary organizational level overview graphical interface 310, according to an embodiment. In an embodiment, graphical interface 310 includes graphical presentations summarizing performances of powered devices 110 located at different facilities managed by an organization. For each facility, the graphical presentation may include, for example, the sum or average of the overall equipment effectiveness (OEE) related to all the powered devices 110 within the facility. The OEE calculation, as understood by those skilled in the art, is a metric indicative of the availability, performance, and output quality each powered device. The graphical interface 310 may also provide other information, for example, total off-time, idle-time, and cut-time of the powered devices 110 within each facility within a given period of time. Such information may be presented graphically to the user via, for example, a pie chart, for each facility. The user may interactively select the period of time, e.g., an hour, 8 hours, 24 hours, a week, etc. for which the operational statistics are calculated and presented.

Figure 15:
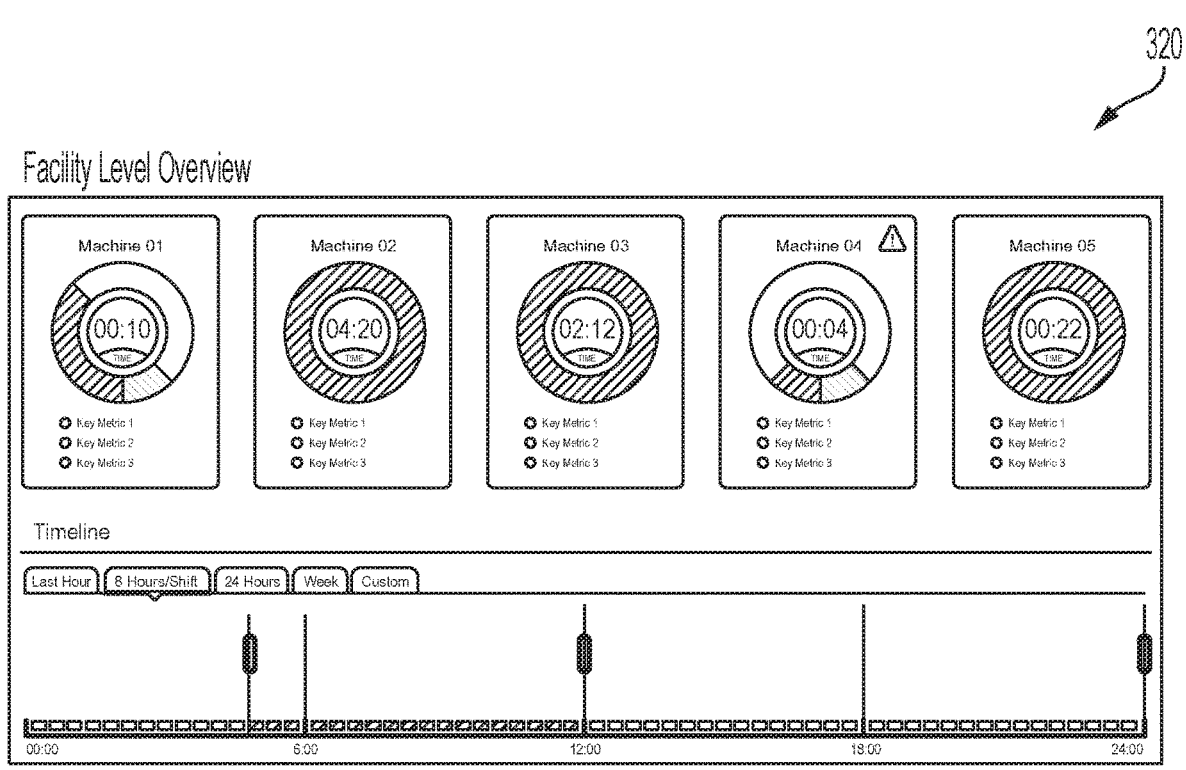
FIG. 15 depicts an exemplary facility level overview graphical interface, according to an embodiment.

FIG. 15 depicts an exemplary facility level overview graphical interface 320, according to an embodiment. In an embodiment, graphical interface 320 includes graphical presentations summarizing performances of different powered devices 110 within a facility. For each powered device 110, the graphical presentation may include, for example, the current status and/or ON-time of the device 110, as well as the total off-time, idle-time, and cut-time of the device 110 within a given period of time. Such information may be presented graphically to the user via, for example, a pie chart, a bar chart, etc. The user may interactively select the period of time, e.g., an hour, 8 hours, 24 hours, a week, etc. for which the operational statistics are calculated and presented. The user may also be alerted of an abnormality or failure related to one of the powered devices 110.

Figure 16:
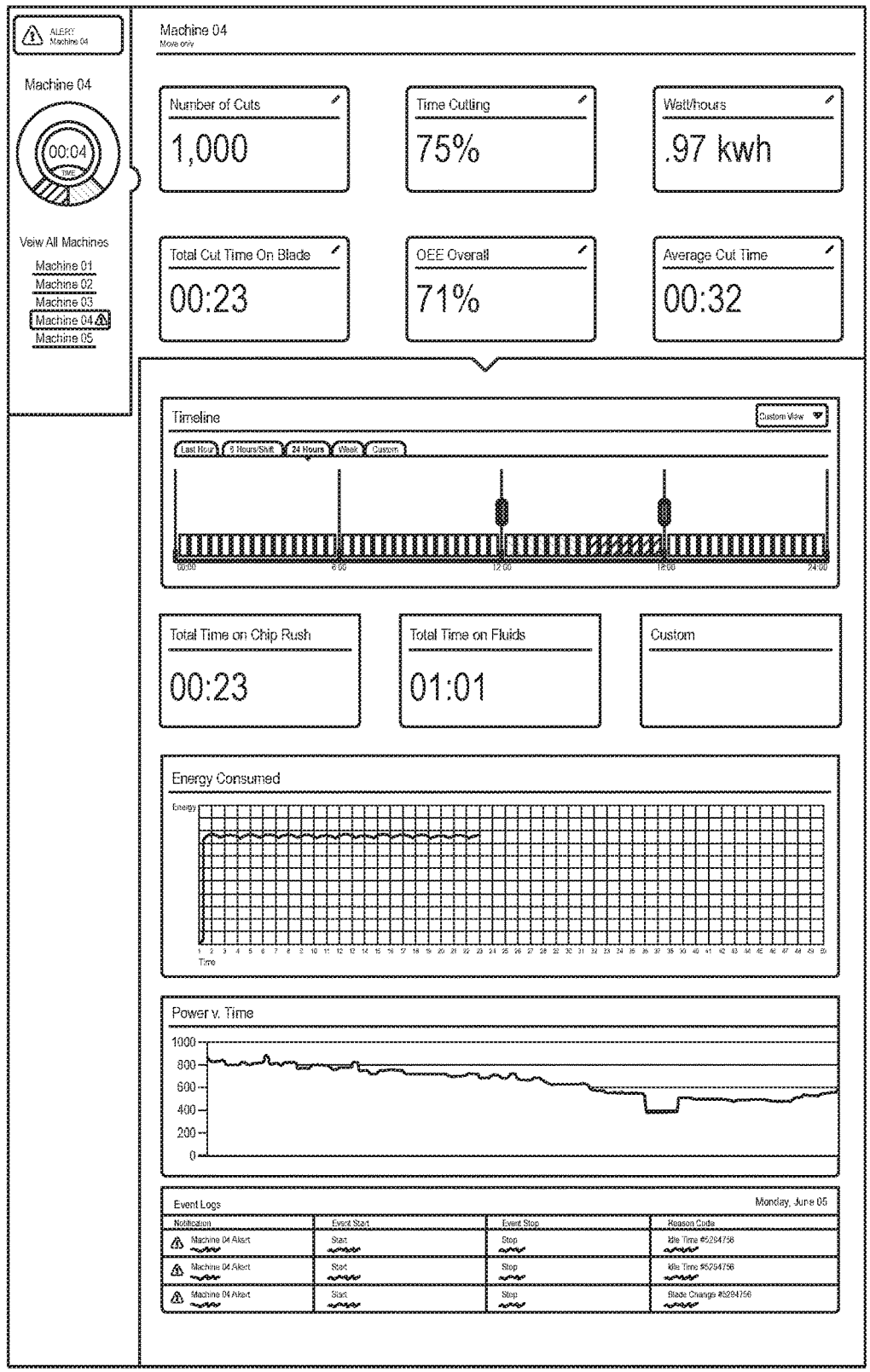
FIG. 16 depicts an exemplary device level view graphical interface, according to an embodiment.

FIG. 16 depicts an exemplary device level view graphical interface 330, according to an embodiment. In an embodiment, graphical interface 330 includes graphical presentations of different performance metrics related to a powered device 110. Such metrics include, but are not limited to, the total number of cuts performed within a given period of time, the percentage of time the device 110 was busy cutting, power consumption per hour, total cut time that the device 110 has been busy cutting since the last change of saw blade, the OEE calculation, and the average cut time. In addition, a graphical presentation relating to the current status and/or ON-time of the device 110, as well as the total off-time, idle-time, and cut-time of the device 110 within a given period of time, is provided to the user. Such information may be presented graphically to the user via, for example, a pie chart, a bar chart, etc. The user may interactively select the period of time, e.g., an hour, 8 hours, 24 hours, a week, etc. for which the operational statistics are calculated and presented. In an embodiment, one or more graphs related to energy consumption and power v. time are also displayed. In an embodiment, a list of alerts associated with the device 110 are also provided to the user.

Figure 17:
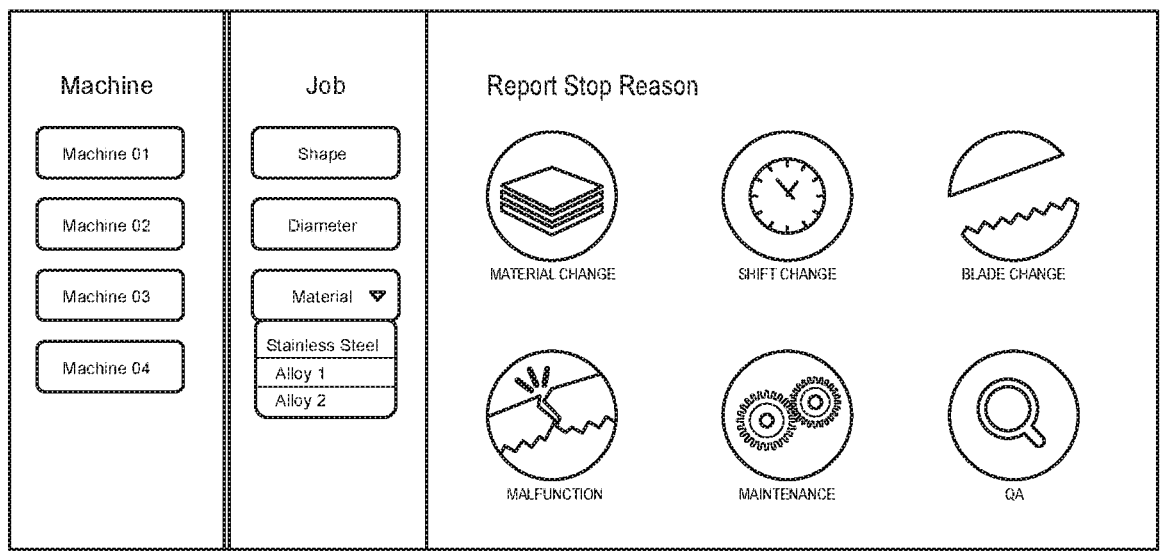
FIG. 17 depicts an exemplary graphical interface for an operator of the device, according to an embodiment.

In an embodiment, an operator of the powered device 110 is also given with the ability to provide information relating to an operation of the device 110 via a user interface 370, depicted in FIG. 17, according to an embodiment. As shown herein, in an embodiment, interface 370 enables the operator to log the types of material being cut, shaft changes, blade changes, malfunctions, maintenance, etc. In an embodiment, interface 370 also enables the operator to specify information relating to a specific cutting operation, e.g., the shape, diameter, and material of the workpiece being cut. This information may be used by the data analysis unit 160 to manage operation data of the powered device 110.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The invention claimed is:

1. A system comprising:
a current sensor arranged to sense current drawn by an electric motor of a powered device through an alternating-current (AC) power line from a power supply and provide current data related to the powered device, wherein the electric motor is configured to drive an operating member to perform an operation;
a monitoring device arranged to receive the current data from the electrical sensor, the monitoring device including a controller configured to process the current data and calculate performance data associated with the powered device as a function of the current data, the performance data being related to load applied to the electric motor of the powered device, wherein the performance data includes at least one of a number of operations, operation time, and average operation time;

a data communication device communicating with the monitoring device and arranged to receive the performance data associated with the powered device; and a computing device including a graphical user interface, the computer device receiving a user's selection of the powered device from a list of powered devices and presenting the performance data to the user via the graphical user interface in response to the user's selection, wherein the monitoring device is configured to detect an operation cycle of the electric motor based on the current data and compare a current waveform associated with the operation cycle to a plurality of predetermined operation cycle current waveforms to determine a type of workpiece being operated on by the powered device.

2. The system of claim 1, wherein the current sensor is provided as a clamping device clamped on a power cord extending from the power source to the powered device.

3. The system of claim 1, wherein the performance parameter further includes efficiency of the powered device based on the current data.

4. The system of claim 3, wherein the powered device is an industrial band saw.

5. The system of claim 4, wherein the monitoring device is configured to determine at least one of a number of cuts and an average time per cut for the industrial band saw based on the current data.

6. The system of claim 3, wherein the computer device receives the user's selection of a period of time and presents at least one of the number of operations, operation time, average operation time, and efficiency of the powered device to the user within the period of time via the graphical user interface.

7. The system of claim 1, wherein the monitoring device is configured to detect when the motor is turned ON when current draw increases from zero to a baseline value, and detect the operation cycle of the electric motor when the current draw cycles from the baseline value to an upper value and back to the baseline value.

8. The system of claim 7, wherein the monitoring device is configured to calculate at least one of the number of operations, total operation time, average operation time, and efficiency of the powered device based on the number of operation cycles within a given time period.

9. The system of claim 1, wherein the monitoring device is configured to compare a current waveform associated with the operation cycle to a predetermined operation cycle current waveform to determine abnormalities associated with the operation cycle.

10. The system of claim 9, wherein the powered device is an industrial band saw having a cutting blade and the monitoring device is configured to determine that the cutting blade does not operate at a normal cutting speed based on variations between at least one of duration, magnitude, the rate of rise time, and the rate of fall time of the current waveform associated with the operation cycle in comparison to the predetermined operation cycle current waveform.

11. A system comprising:

a plurality of current sensors associated with a plurality of powered devices, each current sensor being arranged to sense current drawn by an electric motor of an associated powered device through an alternating-current (AC) power line from a power supply and provide current data related to the powered device, wherein the electric motor is configured to drive an operating member to perform an operation;

a plurality of monitoring devices each arranged to receive the current data from the electrical sensor, each monitoring device including a controller configured to process the current data and calculate performance data associated with the powered device as a function of the current data, the performance data being related to load applied to the electric motor of the powered device, wherein the performance data includes at least one of a number of operations, operation time, and average operation time, and wherein the monitoring device is configured to detect an operation cycle of the electric motor based on the current data and compare a current waveform associated with the operation cycle to a plurality of predetermined operation cycle current waveforms to determine a type of workpiece being operated on by the powered device;

a device management unit configured to manage the plurality of monitoring devices to transmit performance data associated with the plurality of powered devices to a remote server; and a computing device including a graphical user interface, the computer device receiving a user's selection associated with one of the plurality of powered devices from a list and presenting the performance data associated with the selection to the user in response via the graphical user interface.

12. A monitoring device comprising:

a housing;

a current input interface supported by the housing and arranged to be electrically coupled to a current sensor, the current sensor being provided to sense current drawn by an electric motor of a powered device through an alternating-current (AC) power line from a power supply and provide current data related to the powered device, wherein the electric motor is configured to drive an operating member to perform an operation; and a controller configured to process the current data to obtain performance data associated with the powered device, the performance data being related to load applied to the electric motor of the powered device, wherein the performance data includes at least one of a number of operations, operation time, and average operation time, wherein the controller is configured to detect an operation cycle of the electric motor based on the current data and compare a current waveform associated with the operation cycle to a plurality of predetermined operation cycle current waveforms to determine a type of workpiece being operated on by the powered device.

13. The monitoring device of claim 12, wherein the housing is mountable on the industrial machine and the current sensor comprises a clamp mounted outside an insulation sleeve of the power line.

14. The monitoring device of claim 12, configured to detect when the motor is turned ON when current draw increases from zero to a baseline value, and detect an operation cycle by the electric motor when the current draw cycles from the baseline value to an upper value and back to the baseline value.

* * * * *